(12) United States Patent
Muraki

(10) Patent No.: US 10,656,219 B2
(45) Date of Patent: May 19, 2020

(54) DISCONNECTION DETECTING DEVICE, SIGNAL PROCESSING UNIT AND DISCONNECTION DETECTION METHOD

(71) Applicant: Yamaha Corporation, Hamamatsu-shi (JP)

(72) Inventor: Yasuyuki Muraki, Hamamatsu (JP)

(73) Assignee: YAMAHA CORPORATION, Hamamatsu-Shi (JP)

(*) Notice: Subject to any disclaimer, the term of this patent is extended or adjusted under 35 U.S.C. 154(b) by 244 days.

(21) Appl. No.: 15/922,030

(22) Filed: Mar. 15, 2018

(65) Prior Publication Data

US 2018/0267093 A1 Sep. 20, 2018

(30) Foreign Application Priority Data

Mar. 15, 2017 (JP) ................................ 2017-050529

(51) Int. Cl.
*G01R 31/50* (2020.01)
*G08B 29/04* (2006.01)
*H04R 1/28* (2006.01)

(52) U.S. Cl.
CPC ............ *G01R 31/50* (2020.01); *G08B 29/04* (2013.01); *H04R 1/2803* (2013.01); *H04R 2420/05* (2013.01)

(58) Field of Classification Search
CPC .... G01R 31/50; G01R 31/026; H04R 1/2803; H04R 2420/05; H04R 29/001; G08B 29/04
See application file for complete search history.

(56) References Cited

FOREIGN PATENT DOCUMENTS

JP    H04307374 A    10/1992
JP    3775233 B2     5/2006

OTHER PUBLICATIONS

Office Action issued in Japanese Appln. No. 2017-050529 dated Aug. 28, 2018. English Translation provided.
Office Action issued in Chinese Appln. No. 201810214791.6 dated Feb. 3, 2020. English translation provided.

*Primary Examiner* — Amy He
(74) *Attorney, Agent, or Firm* — Rossi, Kimms & McDowell LLP

(57) ABSTRACT

A disconnection detecting device includes a confirmation signal outputting module configured to cause a transmission sound signal to be outputted from a signal processing unit, and a detector. The transmission sound signal includes a confirmation signal having a frequency that differs from a frequency band for use in communicating information contained in the transmission sound signal that is sent from the signal processing unit to a communication unit. The detector is configured to detect whether or not a disconnection is occurring in connection wires based on the transmission sound signal including the confirmation signal that is returned from the communication unit to the signal processing unit via the connection wires.

13 Claims, 6 Drawing Sheets

DISCONNECTION DETECTING DEVICE, SIGNAL PROCESSING UNIT AND DISCONNECTION DETECTION METHOD

CROSS REFERENCE TO RELATED APPLICATIONS

This application is based on Japanese Patent Application (No. 2017-050529) filed on Mar. 15, 2017, the contents of which are incorporated herein by way of reference.

BACKGROUND

The present invention relates to a disconnection detecting device, a signal processing unit and a disconnection detection method.

Conventionally, there are notification systems that inform of emergency. In these notification systems, for example, a communication unit and a signal processing unit are connected via connection wires. Although a transmission line from the signal processing unit to the communication unit is normal, in a case where a reception line from the communication unit to the signal processing unit is abnormal, emergency information cannot be received normally by the signal processing unit, whereby signal processing cannot be executed in the signal processing unit at a later stage.

Incidentally, for example, Patent Literature 1 describes a detection method as a method for detecting abnormality in such a notification system. In a notification system for informing of emergency described in Patent Literature 1, a predetermined sound signal in an audible frequency band is emitted from a speaker as an activation message when the system is activated to inform a user of the activation of the system, and a loop-back signal that is a signal resulting from inputting the emitted predetermined sound signal through a microphone is detected and analyzed, to thereby diagnose the abnormality of the emergency notification system.

[Patent Literature 1] Japanese Patent Publication No. 3775233

SUMMARY

However, although the emergency notification system described in Patent Literature 1 can execute the diagnosis of abnormality occurring in the signal line from the portion where the predetermined sound signal is generated to the speaker and the microphone, but the emergency notification system is not intended to detect a disconnection occurring in the connection wires between the communication unit and the signal processing unit.

The invention has been made in view of these situations and an object thereof is to provide a disconnection detecting device for detecting a disconnection occurring in connection wires between a communication unit and a signal processing unit, a signal processing unit and a disconnection detection method.

To solve the problem described above, according to an aspect of the invention, there is provided a disconnection detecting device including:

a confirmation signal outputting module configured to cause a transmission sound signal to be outputted from a signal processing unit, the transmission sound signal including a confirmation signal having a frequency that differs from a frequency band for use in communicating information contained in the transmission sound signal that is sent from the signal processing unit to a communication unit; and a detector configured to detect whether or not a disconnection is occurring in a connection wire based on the transmission sound signal including the confirmation signal that is returned from the communication unit to the signal processing unit via the connection wire.

According to another aspect of the invention, there is provided disconnection detecting method including:

outputting a transmission sound signal from a signal processing unit, the transmission sound signal including a confirmation signal having a frequency that differs from a frequency band for use in communicating information contained in the transmission sound signal that is sent from the signal processing unit to a communication unit; and detecting whether or not a disconnection is occurring in connection wires based on the transmission sound signal including the confirmation signal that is returned from the communication unit to the signal processing unit via the connection wires.

Thus, as has been described heretofore, the invention can detect a disconnection occurring in the connection wires between the communication unit and the signal processing unit.

DETAILED DESCRIPTION OF EXEMPLIFIED EMBODIMENTS

Figure 1:
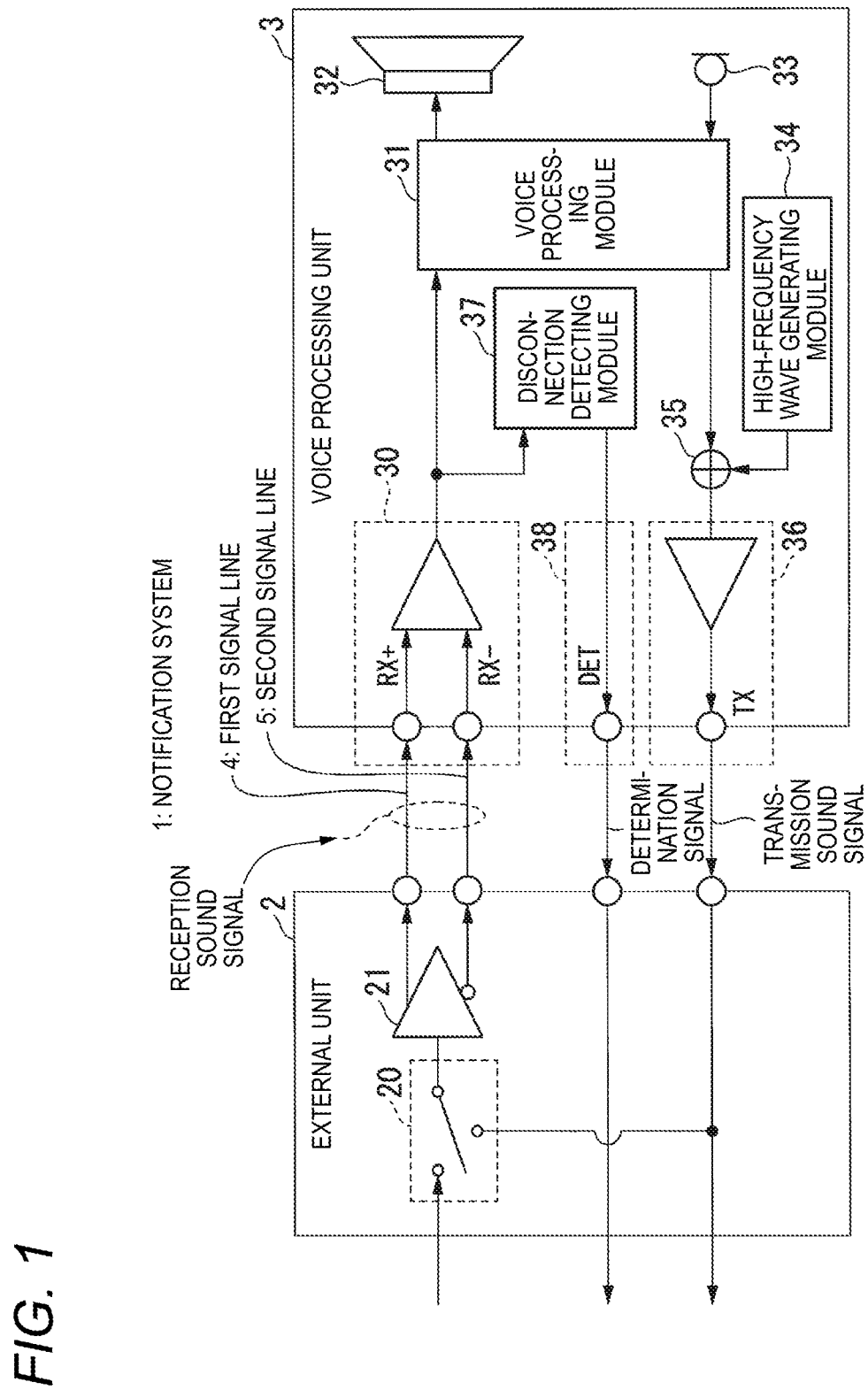
FIG. 1 is a block diagram showing the configuration of a notification system 1 according to a first embodiment of the invention.

Hereinafter, referring to the drawings, a voice processing unit 3 (an example of a "signal processing unit") and a disconnection detecting module 37 (an example of a "disconnection detecting device") of an embodiment of the invention will be described.

First Embodiment

Firstly, a first embodiment will be described. FIG. 1 is a block diagram showing the configuration of a notification system 1. As shown in FIG. 1, the notification system 1 includes an external unit 2 and a voice processing unit 3.

A sound signal is transmitted between the external unit 2 and the voice processing unit 3. The external unit 2, for example, receives a transmission sound signal from the voice processing unit 3 and sends it to a control center (not shown), while receiving a signal indicating an instruction from the control center to output it to the voice processing unit 3 as a reception sound signal. Thus, the external unit 2 is a communication processing unit.

The external unit 2 includes a switch 20 and a differential output module 21.

The switch 20 switches a signal to be inputted into the differential output module 21 to either of the signal from the control center and the transmission sound signal from the voice processing unit 3 based on a control signal from the voice processing unit 3.

The differential output module 21 outputs the signal from the switch 20 and a signal resulting from inverting the signal from the switch 20. Namely, the differential output module 21 converts a signal inputted into the differential output module 21 into a differential signal and outputs the differential signal so converted. Here, the differential signal is a pair of differential signals that are in an inverse relationship. The differential output module 20 may amplify a signal from the switch 20 at a predetermined amplifying rate and convert the amplified signal into a differential signal for output.

The voice processing unit 3 is connected with the external unit 2 by a first signal line 4 and a second signal line 5. Namely, each of the first signal line 4 and the second signal line 5 is a connection wire by which the external unit 2 and the voice processing unit 3 are connected together. A reception sound signal from the external unit 2 is inputted into the voice processing unit 3 by way of the first signal line 4 and the second signal line 5. The voice processing unit 3 emits the reception sound signal from the external unit 2 loudly. The voice processing unit 3 captures informational voice or sound from the user and performs a voice processing such as an echo cancellation on the captured voice or sound to convert the processed voice or sound into a transmission sound signal for supply to the external unit 2. The voice processing unit 3 detects whether or not the first signal line 4 and the second signal line 5 are each broken and outputs the detection result to the external unit 2 as a determination signal.

The voice processing unit 3 includes a reception module 30, a voice processing module 31, a speaker module 32, a microphone module 33, a high-frequency wave generating module 34, an adding module 35, a transmitting module 36, the disconnection detecting module 37, and an outputting module 38.

A reception sound signal from the external unit 2 is inputted into the reception module 30. The reception sound signal from the external unit 2 is a pair of differential signals. In the example shown in FIG. 1, a positive reception sound signal (hereinafter, referred to as a "positive reception signal") is inputted into the reception module 30 from a reception terminal RX+ by way of the first signal line 4, and a negative reception sound signal (hereinafter, referred to as a "negative reception signal") is inputted into the reception module 30 from a reception terminal RX− by way of the second signal line 5. The reception module 30 synthesizes the positive reception signal and the negative reception signal that input thereinto and outputs the resulting synthetic signal individually to the voice processing module 31 and the disconnection detecting module 37.

Figure 2:
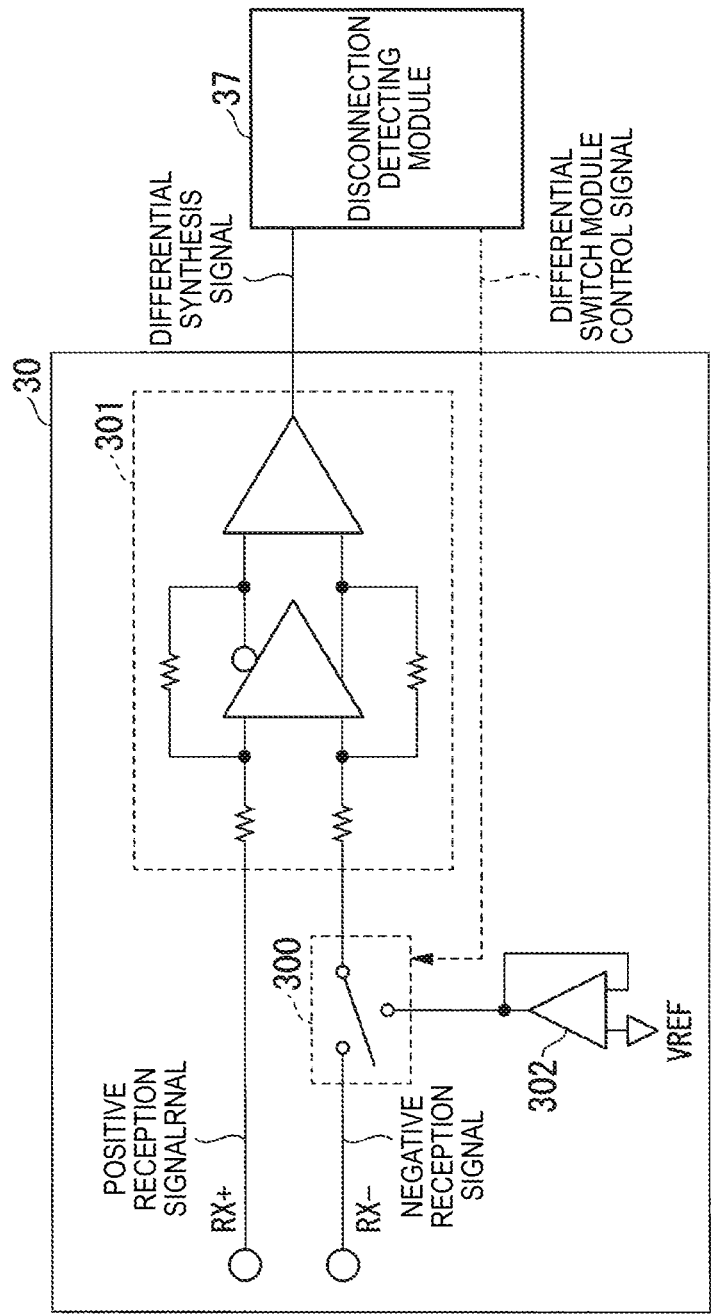
FIG. 2 is a block diagram showing the configuration of a reception module 30 according to the first embodiment.

FIG. 2 is a block diagram showing the configuration of the reception module 30 of the first embodiment. As shown in FIG. 2, the reception module 30 includes a differential selector switch 300, a differential synthesizer module 301, and a reference voltage outputting buffer 302.

The differential selector switch 300 complies with an instruction from the disconnecting detecting module 37 to input either of the negative reception signal from the reception terminal RX− and an output signal from the reference voltage outputting buffer 302 into the differential synthesizer 301.

The differential synthesizer 301 receives the positive reception signal from the reception terminal RX+ and the signal from the differential selector switch 300 that are inputted thereinto, amplifies each of the two inputted signals at a predetermined amplifying rate and synthesizes the amplified signals together. Specifically speaking, the differential synthesizer 301 outputs a difference between the signal resulting from amplifying the positive reception signal from the reception terminal RX+ and the signal resulting from amplifying the signal from the differential selector switch 300. In a case where the differential selector switch 300 inputs the negative reception signal into the differential synthesizer 301, the differential synthesizer 301 outputs a difference between the positive reception signal and the negative reception signal as a differential synthesis signal. The positive reception signal and the negative reception signal are inverse to each other, and hence, the amplitude of the differential synthesis signal becomes twice the amplitude of the amplified positive reception signal by taking away the difference. The differential synthesizer 301 can reduce noise components of the same phase that are superposed on the positive reception signal and the negative reception signal by taking away the difference between the positive reception signal and the negative reception signal. The differential synthesizer 301 outputs the synthesis signal resulting from synthesis of the positive reception signal and the negative reception signal to the voice processing module 31.

The reference voltage outputting buffer 302 supplies a predetermined reference voltage ("VREF" in FIG. 2).

Referring back to FIG. 1, the voice processing module 31 receives the differential synthesis signal that is inputted thereinto from the reception module 30 and outputs the inputted differential synthesis signal to the speaker module 32. A sound signal is inputted into the voice processing module 31 from the microphone module 33. The voice processing module 31 executes a voice processing such as an echo cancellation on the inputted sound signal and outputs the sound signal on which the voice processing has been executed to the transmission module 36.

The speaker module 32 converts the differential synthesis signal (a digital signal) from the voice processing module 31 into an analog signal using a Digital Analog Converter (DAC) (not shown) and outputs the converted analog signal to a speaker (not shown). The speaker converts an electric signal possessed by the analog signal into physical vibrations and emits the physical vibrations to the outside. Namely, the speaker module 32 emits a sound corresponding to the differential synthesis signal outputted from the differential synthesizer 301 via the voice processing module 31.

The microphone module 33 captures sound on the periphery of a place where the microphone module 33 is placed. The sound on the periphery of the microphone module 33 includes the voice of the user, an alarming sound generated by a device that is placed on the circumference of the microphone module 33 and a sound that is emitted from the speaker module 32. The microphone module 33 converts the vibrations of the captured sound into an analog electric signal, converts the converted analog electric signal into a digital signal using an Analog Digital Converter (ADC) (not shown) and outputs the converted digital signal to the voice processing module 31.

The high-frequency wave generating module 34 complies with an instruction from the disconnection detecting module 37 and generates a signal (a confirmation signal) of a predetermined frequency. In this embodiment, the high-frequency wave generating module 34 generates a confirmation signal of a frequency that is out of the audible frequency band.

The audible frequency band means a band of frequencies that a human being can sense them as sound through vibrations of his or her eardrums, and in general, a band of frequencies ranging roughly from 20 [Hz] to 20 [kHz] is referred to as the audible frequency band. However, every human being cannot always hear frequency waves of frequencies that fall within the audible frequency band as sound. Hearing capabilities and ages of individuals often affect largely whether or not they can hear frequency waves of frequencies that fall within the audible frequency band as sound. In this embodiment, the confirmation signal of the frequency that is out of the audible frequency band means a signal of a frequency that a human being has difficulty in general in recognizing as sound through his or her hearing sense. Thus, there will be no problem even when the confirmation signal includes partially a signal of a frequency that falls within the audible frequency band as long as the human being has difficulty in recognizing it as sound through his or her hearing sense. In this embodiment, the high-frequency wave generating module 34 generates a signal that includes a range of frequencies of 16 [kHz] to 24 [kHz] as the frequency that is out of the audible frequency band.

The high-frequency wave generating module 34 includes, for example, a pulse generator and a Dual Tone Multi-Frequency (DTMF) to generate a signal of a predetermined frequency. The DTMF can generate eight different frequencies (tone signals) including 697 [Hz], 770 [Hz], 852 [Hz], 941 [Hz], 1209 [Hz], 1336 [Hz], 1447 [Hz] and 1633 [Hz]. When generating signals using the DTMF, the high-frequency wave generating module 34 executes, for example, a signal processing expressed by an expression (1) below or a signal processing expressed by an expression (2) below on any one of the eight different tone signals described above. By doing so, the high-frequency wave generating module 34 can generate signals of the predetermined frequencies. In the expressions (1) and (2) below, x denotes an arbitrary angle.

$$\cos(2x) = 1 - 2 \times \{\sin(x)\}2 \quad (1)$$

$$\sin(3x) = 3 \times \sin(x) - 4 \times \{\sin(x)\}3 \quad (2)$$

The high-frequency wave generating module 34 makes, for example, the DTMF generate a tone signal of 1209 [Hz] and executes the signal processing expressed by the expression (1) above on the generated tone signal to thereby generate a confirmation signal of a frequency of about 24 [kHz] that is out of the audible frequency band. Additionally, the high-frequency wave generating module 34 makes the DTMF generate a tone signal of a frequency of 697 [kHz] and executes the signal processing expressed by the expression (2) above on the generated tone signal to thereby generate a confirmation signal of a frequency of about 21 [kHz] that is out of the audible frequency band.

The adding module 35 adds a signal from the voice processing module 31 and a signal from the high-frequency wave generating module 34 together. In a case where a signal from the voice processing module 31 includes a sound signal and the high-frequency wave generating module 34 generates a confirmation signal of a frequency that is out of audible frequency band, the adding module 35 superposes the signal of the frequency that differs from that of a sound or voice (a sound signal made up of a frequency that falls within the audible frequency band) that is included in the transmission sound signal from the voice processing module 31, that is, the confirmation signal of the frequency that is out of the audible frequency band on the sound signal from the voice processing module 31. Then, the adding module 35 outputs the resulting signal from the signals added together to the transmitting module 36.

The transmitting module 36 sends the signal from the adding module 35 from a transmission terminal TX to the external unit 2.

Figure 3:
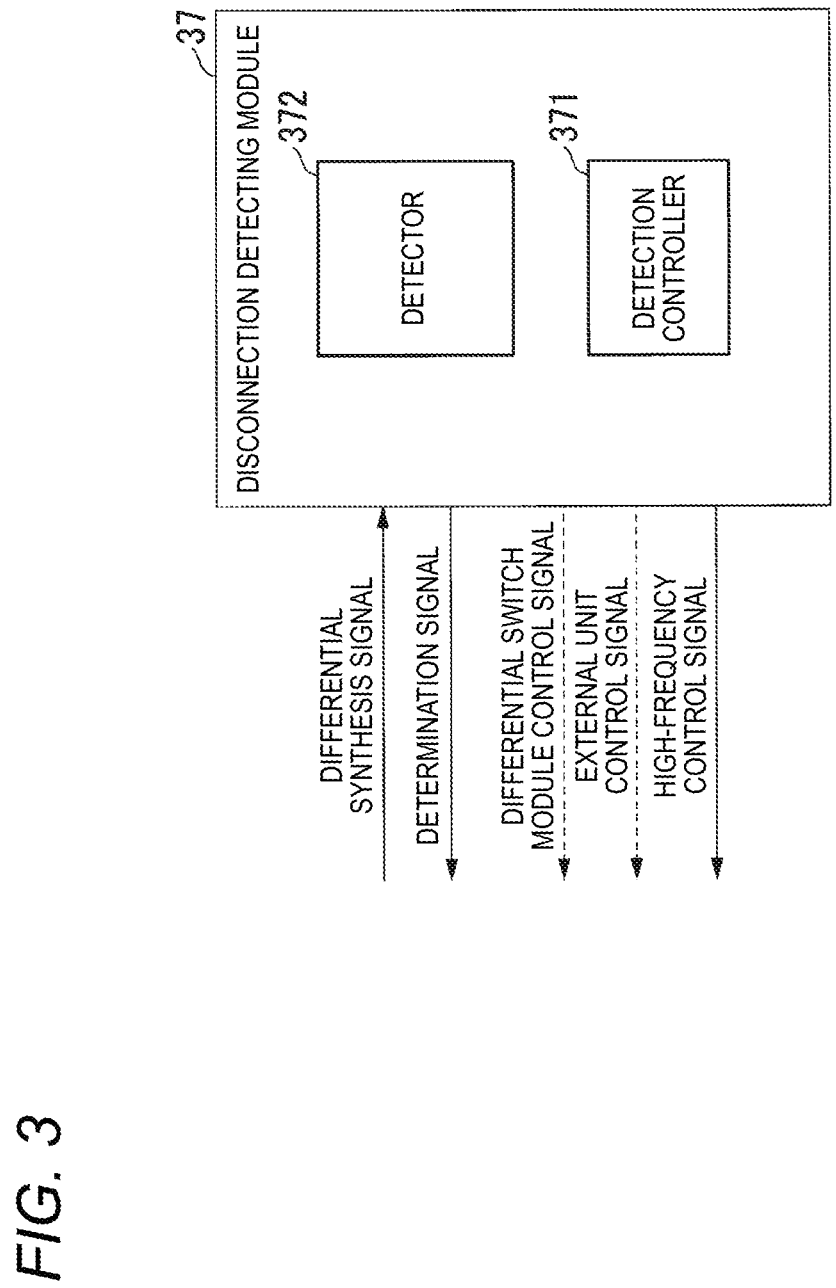
FIG. 3 is a block diagram showing the configuration of a disconnection detecting module 37 according to the first embodiment.

FIG. 3 is a block diagram showing the configuration of the disconnection detecting module 37 of the first embodiment. As shown in FIG. 3, the disconnection detecting module 37 includes a detection controller 371 and a detector 372.

The detection controller 371 controls the high-frequency wave generating module 34. Specifically speaking, the detection controller 371 outputs to the high-frequency wave generating module 34 a high frequency control signal indicating an instruction to make the high-frequency wave generating module 34 generate a signal of a predetermined frequency (a high frequency). The high frequency control signal may include information related to a frequency, amplitude or the like of a high-frequency wave to be generated, in addition to the instruction to make the high-frequency wave generating module 34 generate a high-frequency wave. For example, the detection controller 371 makes the high-frequency wave generating module 34 generate a high-frequency wave at a timing at which a disconnection detection is performed in each of the first signal line 4 and the second signal line 5. A high-frequency wave generated by the high-frequency wave generating module 34 is superposed on the transmission sound signal via the adding module 35 as a confirmation signal.

The detection controller 371 also controls the external unit 2. Specifically speaking, when executing a disconnection detection, the detection controller 371 controls the external unit 2 by outputting an external unit control signal to the switch 20 of the external unit 2 and allows the transmission sound signal from the voice processing unit 3 to be inputted into the differential output module 21. This enables the voice processing unit 3 to loop back the transmission sound signal from the transmitting module 36 so as to be received by the reception module 30.

The detector 372 executes a disconnection detection based on the amplitude of the signal from the reception module 30. A disconnection detection is executed here on the premise that the transmission side functions properly. Here, the transmission side includes, for example, the transmitting module 36, a signal line between the transmission terminal TX and a terminal of the external unit 2 into which the transmission sound signal is inputted and a line from the terminal into which the transmission sound signal is inputted to two output terminals of the differential outputting module 21.

The detector 372 executes a disconnection detection based on the amplitude (an example of a "signal component") of the signal that is outputted from the reception module 30. The detector 372 detects whether or not a disconnection is present in the first signal line 4 and the second signal line 5 by comparing the amplitude of the signal from the reception module 30 with a predetermined reference value that is determined in advance.

Figure 4A:
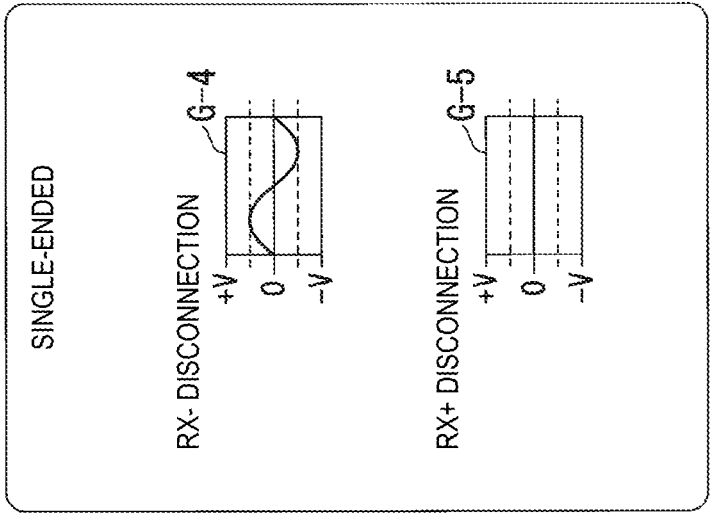
FIGS. 4A and 4B show diagrams depicting operations performed by the disconnection detecting module 37 according to the first embodiment.
Figure 4B:
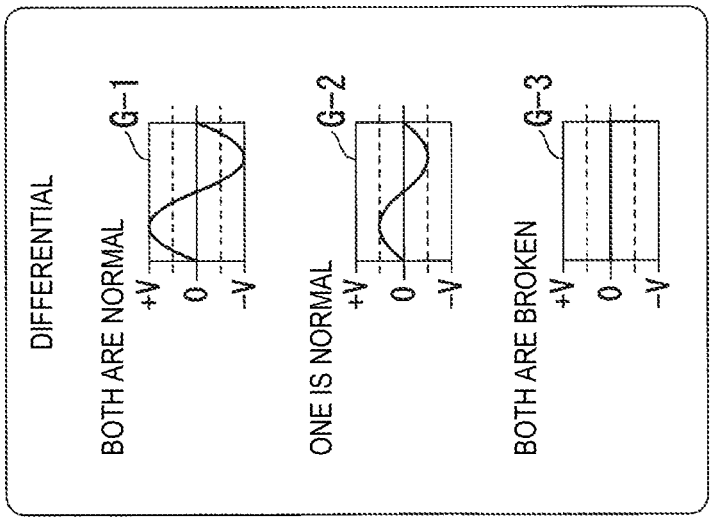

A disconnection detection method used by the detector 372 in executing a disconnection detection will be described by the use of FIGS. 4A and 4B. FIGS. 4A and 4B show diagrams depicting operations to be performed by the detector 372. FIG. 4A shows images of signals that are outputted from the reception module 30 when the detector 372 performs a disconnection detection. FIG. 4B shows images of signals that are outputted from the reception module 30 when the differential selector switch 300 is switched from a line from the reception terminal RX− to a line from the reference voltage outputting buffer 302 to make a single ended input into the differential synthesizer 301.

In waveforms shown in FIGS. 4A, and 4B, an axis of abscissa denotes time, and an axis of ordinate denotes signal level. "+V" and "−V" that are shown beside the axis of ordinate in each of the waveforms in FIGS. 4A, and 4B denote a signal amplitude when the reception signals are differentially synthesized with both the transmitting module 36 and the reception module 30 being normal.

A waveform G-1 in FIG. 4A shows an image of a waveform of a signal that is outputted from the reception module 30 when the signal lines of the first signal line 4 and the second signal line 5 are both normal (are both not broken). As the waveform G-1 shows, in a case where the signal lines of the first signal line 4 and the second signal line 5 are both normal and the reception module 30 is also normal, a confirmation signal that is outputted from the reception module 30 becomes a signal having an amplitude from −V to +V. In a case where the signal from the reception module 30 is a signal having the same amplitude level as that of the waveform G-1, the detector 372 determines that the signal lines of the first signal line 4 and the second signal line 5 are both normal and that the signal lines are both not broken.

For example, the detector 372 compares the amplitude of the signal from the reception module 30 with a predetermined first reference value. In relation to a signal level in FIG. 4A, the predetermined first reference value is a value ranging from V/2 to V. In a case where the amplitude of the signal from the reception module 30 exceeds the first reference value, the detector 372 determines that the confirmation signal has normally been outputted from the reception module 30. As this occurs, the detector 372 determines that the signal lines of the first signal line 4 and the second signal line 5 are both normal (are both not broken).

A waveform G-2 shows an image of a waveform of a signal that is outputted from the reception module 30 when either of the first signal line 4 and the second signal line 5 is normal, while the other is broken. As the waveform G-2 shows, in a case where either of the signal lines of the first signal line 4 and the second signal line 5 is normal, while the other is broken, the reception module 30 outputs a confirmation signal having an amplitude from −V/2 to +V/2. In a case where the reception module 30 outputs a signal having the same amplitude level as that of the waveform G-2, the detector 372 decides that either of the first signal line 4 and the second signal line 5 is normal, while the other is broken.

For example, the detector 372 compares the amplitude of the signal from the reception module 30 with the first reference value described above and a predetermined second reference value. In relation to the signal level in FIG. 4A, the predetermined second reference value is a value ranging from 0 (zero) to V/2. The detector 372 compares the amplitude of the signal from the reception module 30 individually with the first reference value and the second reference value that are described above. In the case where the amplitude of the signal from the reception module 30 is lower than the first reference value and higher than the second reference value, the detector 372 determines that only one of the signal lines of differential signals of the reception module 30 outputs the signal. Then, the detector 372 determines that either of the first signal line 4 and the second signal line 5 is normal, while the other is not normal (is broken).

A waveform G-3 shows an image of a waveform of a signal that is outputted from the reception module 30 when both of the signal lines made up of the first signal line 4 and the second signal line 5 are broken. As the waveform G-3 shows, in a case where the first signal line 4 and the second signal line 5 are both broken, the reception module 30 outputs no confirmation signal. In a case where the reception module 30 outputs a signal having the same waveform as the waveform G-3, that is, in a case where the amplitude of the outputted signal is 0 (zero), the disconnection detecting module 37 decides that the first signal line 4 and the second signal line 5 are both broken.

For example, the detector 372 compares the amplitude of the signal from the reception module 30 with the second reference value described above. In a case where the amplitude of the signal from the reception module 30 is lower than the second reference value, the detector 372 determines that the reception module 30 outputs no confirmation signal. As this occurs, the detector 372 determines that the first signal line 4 and the second signal line 5 are both broken.

It should be noted that the detector 372 may include a plurality of reference values according to amplitude levels of confirmation signals that the high-frequency waveform generating module 34 is caused to generate, in addition to the first reference value and the second reference value that are described above.

When determining that either of the first signal line 4 and the second signal line 5 is normal, while the other is broken, the detector 372 detects which of the first signal line 4 and the second signal line 5 is broken.

Specifically speaking, when the detector 372 decides that either of the first signal line 4 and the second signal line 5 is broken, the detector 372 causes only the positive reception signal to be inputted into the differential synthesizer 301 and determines which of the first signal line 4 and the second signal line 5 is normal and broken based on the amplitude of a signal that is outputted from the reception module 30.

Here, the detector 372 causes only the positive reception signal to be inputted into the differential synthesizer 301 by controlling the differential selector switch 300 of the reception module 30. The detector 372 controls the differential selector switch 300 to switch signals to be inputted into the differential synthesizer 301 from a signal supplied from the reception terminal RX− (that is, a negative reception signal) to a signal supplied from the reference voltage outputting buffer 302 (that is, a reference voltage outputting signal). By doing so, the negative reception signal that has been inputted into the differential synthesizer 301 until then is switched to a constant reference voltage value (for example, 0 [V]). Namely, in the case where a voltage value that is outputted from the reference voltage outputting buffer 302 is 0 [V], the differential synthesizer 301 output only a signal that corresponds to the positive reception signal that flows through the first signal line 4.

A waveform G-4 shown in FIG. 4B shows an image of a waveform of a signal that is outputted from the reception module 30 when only the positive reception signal is inputted into the differential synthesizer 301 with the first signal line 4 and the second signal line 5 being normal and broken, respectively. As the waveform G-4 shows, in the event that the first signal line 4 is not broken, even in the case where only the positive reception signal is inputted into the differential synthesizer 301, the reception module 30 outputs a signal having an amplitude from −V/2 to +V/2. When the reception module 30 outputs a signal having an amplitude level that is the same as that of the waveform G-4 with only the positive reception signal inputted into the differential synthesizer 301, the detector 372 decides that the first signal line 4 is normal (is not broken). As this occurs, the detector 372 decides that the signal line of the second signal line 5 is broken.

A waveform G-5 shows an image of a waveform of a signal that is outputted from the reception module 30 when only the positive reception signal is inputted into the differential synthesizer 301 with the first signal line 4 being broken and the second signal line 5 being normal. As the waveform G-5 shows, with the first signal line 4 left broken, in the case where only the positive reception signal is inputted into the differential synthesizer 301, the reception module 30 outputs no confirmation signal. In the case where the reception module 30 outputs a signal having an amplitude level that is the same as that of the waveform G-5, that is, no amplitude of the signal is detected when only the positive reception signal is inputted into the differential synthesizer 301, the detector 372 decides that the signal line of the first signal line 4 is not normal or is broken. As this occurs, the detector 372 decides that the signal line of the second signal line 5 is normal.

In this way, when it determines that either of the first signal line 4 and the second signal line 5 is broken or a disconnection is occurring in either of the first signal line 4 and the second signal line 5, the detector 372 decides which of the first signal line 4 and the second signal line 5 is normal and broken. The detector 372 controls the differential selector switch 300 to switch the signal line along which a signal is inputted into the differential synthesizer 301 from the reception terminal RX− side to the reference voltage outputting buffer 302 side, causing only the positive reception signal that flows through the first signal line 4 to be inputted into the differential synthesizer 301. Then, the detector 372 determines which of the first signal line 4 and the second signal line 5 is broken based on the amplitude of a signal outputted from the reception module 30. In the description made above, although the comparison using the second reference value is described as being made after the comparison using the first reference value is made, the comparison using the first reference value may be made after the comparison using the second reference value is made. In a case where the comparison using the first reference value is made first, it is possible to detect first that neither the first signal line 4 nor the second signal line 5 is broken, that is, no disconnection is occurring in both the first signal line 4 and the second signal line 5. On the other hand, in a case where the comparison using the second reference value is made first, it is possible to detect first that the first signal line 4 and the second signal line 5 are both broken, that is, a disconnection is occurring in both the first signal line 4 and the second signal line 5.

The detector 372 outputs the determined result to the outputting module 38.

The outputting module 38 outputs a determination result sent from the disconnection detecting module 37 from an output terminal DET to the external unit 2. This enables the external unit 2 to send the determination result to the control center. Although the outputting module 38 outputs the detection result to the external unit 2, the invention is not limited thereto. For example, the outputting module 38 may include a display device (not shown) for informing the user of the determination result so that the detection result is displayed on the display device. Alternatively, the outputting module 38 may be configured to inform the user of the detection result by emitting voice or alarming sound from the speaker module 32.

Figure 5:
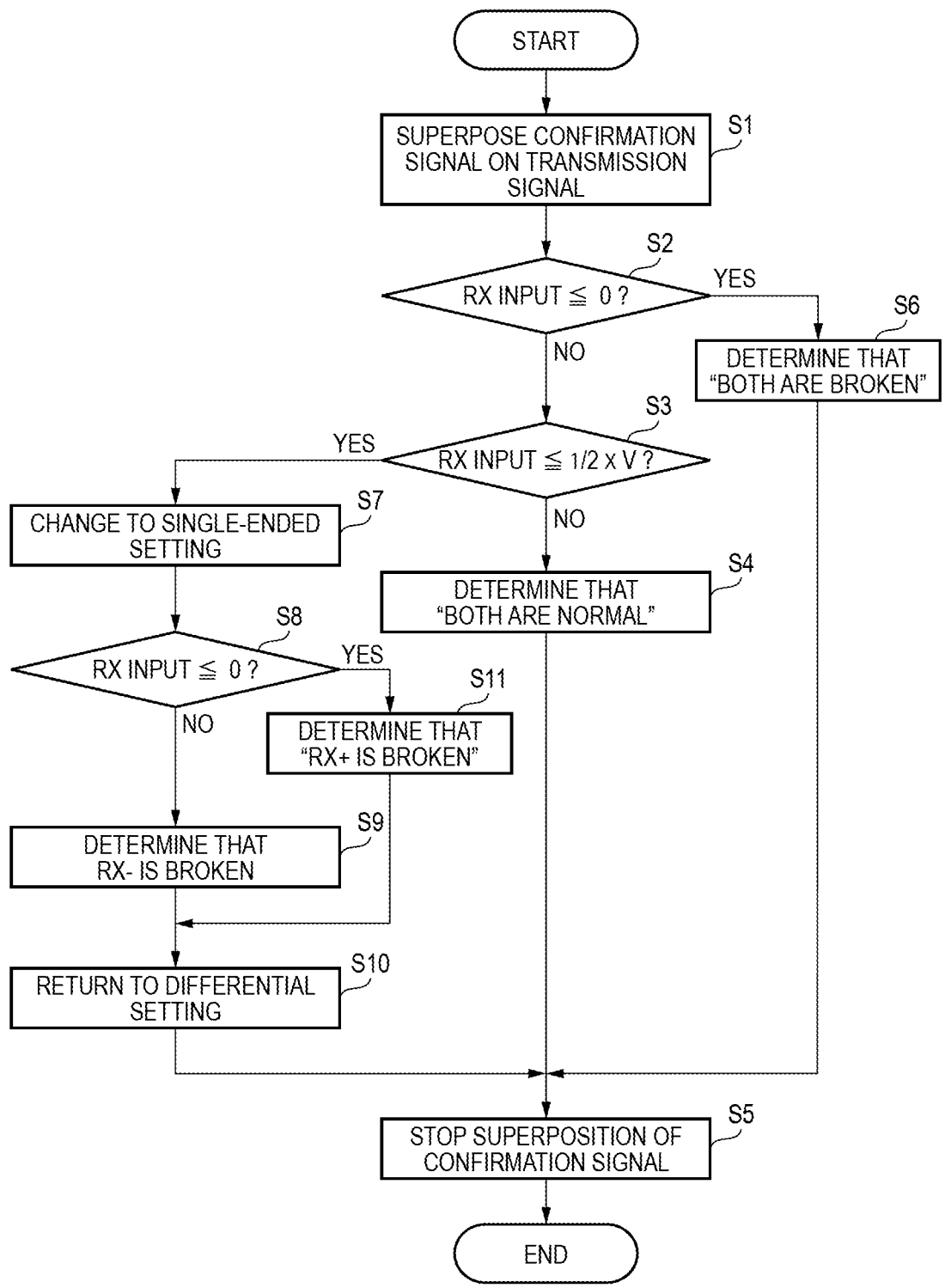
FIG. 5 is a flow chart showing a flow of operations performed by the disconnection detecting module 37 according to the first embodiment.

Here, a flow of disconnection detecting operations performed by the disconnection detecting module 37 will be described using FIG. 5. FIG. 5 is a flow chart showing a flow of operations performed by the disconnection detecting module 37.

Firstly, the disconnection detecting operations shown in the flow chart are performed on the premise that the switch 20 of the external unit 2 is designed to input a transmission sound signal from the voice processing unit 3 into the differential outputting module 21. Namely, the disconnection detecting module 37 is designed to loop back a transmission sound signal from the transmitting module 36 using the external unit 2.

The disconnection detecting module 37 superposes a confirmation signal on a transmission sound signal (Step S1). The disconnection detecting module 37 makes the high-frequency wave generating module 34 generate a confirmation signal at a timing at which a disconnection detection is executed. The adding module 35 superposes the confirmation signal generated by the high-frequency wave generating module 34 on a transmission sound signal. The timing at which a disconnection detection is executed may be an arbitrary timing, and for example, the disconnection detection may be executed periodically or may be executed when the voice processing unit 3 is activated, at a timing at which transmission or reception is completed in the voice processing unit 3 or at a timing during performance of transmission or reception in the voice processing unit 3.

Next, the disconnection detecting module 37 decides whether or not an amplitude of a signal "RX Input" from the reception module 30 is equal to or smaller than 0 (zero) (Step S2). The disconnection detecting module 37 decides whether or not the amplitude of the "RX Input" is equal to or smaller than 0 (zero) by comparing the "RX Input" with a reference value (0 [V]).

When it determines that the amplitude of the "RX Input" is not equal to or smaller than 0 (zero) (No in Step S2), the disconnection detecting module 37 causes the flow of disconnecting detecting operations to Step S3. On the other hand, when it determines that the amplitude of the "RX Input" is equal to or smaller than 0 (zero) (Yes in Step S2), the disconnection detecting module 37 causes the flow of disconnection detecting operations to Step S6.

When it determines that the amplitude of the "RX Input" is not equal to or smaller than 0 (zero), the disconnecting detecting module 37 decides whether or not the amplitude of the "RX Input" is equal to or smaller than ($\frac{1}{2} \times V$) (Step S3). When it determines that the amplitude of the "RX Input" is not equal to or smaller than ($\frac{1}{2} \times V$) (No in Step S3), the disconnection detecting module 37 causes the flow of disconnection detecting operations to Step S4. On the other hand, when it determines that the amplitude of the "RX Input" is equal to or smaller than ($\frac{1}{2} \times V$) (Yes in Step S3), the disconnection detecting module 37 causes the flow of disconnection detecting operations to Step S7.

When it determines that the amplitude of the "RX Input" is not equal to or smaller than ($\frac{1}{2} \times V$), the disconnection detecting module 37 determines that the differential signals in the transmitting module 36 and the reception module 30 are both normal and that no disconnection is occurring (Step S4). Thus, the disconnection detecting module 37 stops superposing the confirmation signal on the transmission sound signal (Step S5). Namely, the disconnection detecting module 37 stops generating a confirmation signal. The disconnection detecting module 37 ends the series of disconnection detecting operations then.

When it determines that the amplitude of the extracted "RX Input" is equal to or smaller than (½×V) (Yes in Step S3), the disconnection detecting module 37 controls the differential selector switch 300 to switch the signal lines to enable only a positive reception signal to be inputted into the differential synthesizer 301. Namely, the disconnection detecting module 37 switches the output from the differential synthesizer 301 from a differential signal to a single-ended signal (Step S7). Then, the disconnection detecting module 37 decides whether or not the amplitude of the "RX Input" is equal to or smaller than 0 (zero) (Step S8).

When it determines that the amplitude of the "RX Input" is not equal to or smaller than 0 (zero) (No in Step S8), the disconnection detecting module 37 determines that the negative reception signal is disconnected (Step S9). The disconnection detecting module 37 returns the signal setting from the single-ended setting to the differential setting (Step S10). Namely, the disconnecting module 37 returns the differential selector switch 300 that is switched in Step S7 to the position where it stays before switching in Step S7, so that the positive reception signal and the negative reception signal are both inputted into the differential synthesizer 301. Then, the disconnection detecting module 37 advances the flow of disconnection detecting operations to Step S5 after the operation in Step S10 is completed.

On the other hand, when it determines that the amplitude of the "RX Input" is equal to or smaller than 0 (zero) (Yes in Step S8), the disconnection detecting module 37 determines that the positive reception signal is disconnected (Step S11). Then, the disconnection detecting module 37 performs the operation shown in Step S10. The disconnection detecting module 37 advances the flow of disconnection detecting operations to Step S5 after the operation in Step S10 is completed.

Thus, as has been described heretofore, the disconnection detecting module 37 (the example of the "disconnection detecting device") of the first embodiment includes the detection controller 371 (an example of a "confirmation signal outputting module") and the detector 372 (an example of a "detector"). The detection controller 371 causes the transmission sound signal that includes the confirmation signal having the frequency that is out of the audible frequency band (an example of a "frequency that differs from a frequency band that is used for communication of information contained in the transmission sound signal that is sent") to be outputted from the voice processing unit 3 (an example of a "signal processing unit") to the external unit 2 (an example of a "communication unit"). The detector 372 detects whether or not the connection wires (for example, the first signal line 4 and the second signal line 5) are broken or a disconnection is occurring in the connection wires based on the transmission sound signal including the confirmation signal that is outputted from the external unit 2 to the voice processing unit 3 via the connection wires.

By doing so, in the disconnection detecting module 37, the transmitting module 36 can send the transmission sound signal including the confirmation signal in which the frequency that is out of the audible frequency band is superposed on the sound signal of the audible frequency band. Additionally, the reception module 30 can receive the transmission sound signal including the confirmation signal sent by the transmitting module 36. Thus, the detector 372 can determine that the connection wires are not broken or a disconnection is not occurring in the connection wires and hence the connection wires are normal when the signal outputted from the reception module 30 includes the confirmation signal. On the other hand, when the signal outputted by the reception module 30 includes no confirmation signal, the detector 372 can determine that the connection wires are broken or a disconnection is occurring in the connection wires. Thus, the disconnection detecting module 37 can detect whether or not a disconnection is occurring in the connection wires between the external unit 2 and the voice processing unit 3.

In the disconnection detecting module 37 of the first embodiment, the connection wires between the external unit 2 and the voice processing unit 3 are made up of the first signal line 4 (an example of a "first signal line") and the second signal line 5 (an example of a "second signal line"). Then, the detector 372 detects whether or not a disconnection is occurring in the first signal line 4 and the second signal line 5 based on the amplitude (an example of a "signal component") of the synthesis signal into which the positive reception signal that flows through the first signal line 4 (an example of a "first signal flowing by way of the first signal line") and the negative reception signal that flows through the second signal line 5 (an example of a "second signal flowing by way of the second signal line") are synthesized.

By doing so, in the disconnection detecting module 37 of the first embodiment, when the amplitude of the signal into which the positive reception signal that flows through the first signal line 4 and the positive reception signal that flows through the second signal line 5 are synthesized and that is outputted from the reception module 30 is about a half the normal amplitude, the detector 372 determines that either of the first signal line 4 and the second signal line 5 is broken or a disconnection is occurring in either of the first signal line 4 and the second signal line 5. Thus, the disconnection detecting module 37 can detect whether or not a disconnection is occurring in the first signal line 4 and the second signal line 5 that make up the connection wires between the external unit 2 and the voice processing unit 3.

In the disconnection detecting module 37 of the first embodiment, the detection controller 371 causes the signals based on both the first signal line 4 and the second signal line 5 or the signal based on either of the first signal line 4 and the second signal line 5 to be inputted into the detector 372. Then, the detector 372 detects any one of conditions in which a disconnection is occurring in both the first signal line 4 and the second signal line 5, a disconnection is occurring in either of the first signal line 4 and the second signal line 5, and the first signal line 4 and the second signal line 5 are both normal.

By doing so, in the disconnection detecting module 37 of the first embodiment, when the detection controller 371 inputs both the positive reception signal sent by way of the first signal line 4 and the negative reception signal sent by way of the second signal line 5 into the reception module 30, the detector 372 can detect that a disconnection is not occurring in both the first signal line 4 and the second signal line 5 in a case where the amplitude of the signal that is outputted from the reception module 30 is equal to the normal amplitude. On the other hand, in a case where the amplitude of the signal that is outputted from the reception module 30 is 0, the detector 372 can detect that a disconnection is occurring in both the first signal line 4 and the second signal line 5.

In addition, in the disconnection detecting module 37 of the first embodiment, when the detection controller 371 inputs one of the signal sent by way of the first signal line 4 and the signal sent by way of the second signal line 5 into the reception module 30, in a case where the amplitude of the signal that is outputted from the reception module 30 is not 0 but takes a value that is less than the normal amplitude, the detector 372 can detect that a disconnection is not occurring in one of the signal lines of the first signal line 4 by way of which the signal is inputted into the reception module 30 and the second signal line 5 by way of which the signal is inputted into the reception module 30, while a disconnection is occurring in the other.

Further, in the disconnection detecting module 37 of the first embodiment, when the detection controller 371 inputs either of the signal sent by way of the first signal line 4 and the signal sent by way of the second signal line 5 into the reception module 30, in a case where the amplitude of the signal that is outputted from the reception module 30 is 0, the detector 372 can detect that a disconnection is occurring in either of the signal lines of the first signal line 4 by way of which the signal is inputted into the reception module 30 and the second signal line 5 by way of which the signal is inputted into the reception module 30. Thus, in the disconnection detecting module 37 of the first embodiment, it is possible to detect that a disconnection is occurring in the first signal line 4 and the second signal line 5 that are the connection wires between the external unit 2 and the voice processing unit 3. In addition to this, when it detects that a disconnection is occurring in either of the first signal line 4 and the second signal line 5, the detector 372 can detect which of the first signal line 4 and the second signal line 5 is broken or is subjected to the disconnection. Detecting which of the first signal line 4 and the second signal line 5 is broken or is subjected to the disconnection enables only the broken signal line to be replaced, thereby making it possible not only to reduce the repairing costs but also to facilitate an analysis of a cause of the disconnection.

In the disconnection detecting module 37 of the first embodiment, the positive reception signal (an example of a "first signal") and the negative reception signal (an example of a "second signal") constitute a pair of differential signals. Thus, in the disconnection detecting module 37 of the first embodiment, the signal that is outputted from the reception module 30 constitutes the synthesis signal into which the positive reception signal and the negative reception signal are synthesized, and the synthesis signal has the amplitude whose magnitude is twice the amplitude of each of the reception signals. Due to this, in the disconnection detecting module 37 of the first embodiment, in addition to the advantage described above, when the detection controller 371 inputs either of the signal sent by way of the first signal line 4 and the signal sent by way of the second signal line 5 into the reception module 30, in a case where the amplitude of the signal that is outputted from the reception module 30 is a half the normal amplitude, the detector 372 determines that the signal line by way of which the signal is inputted into the reception module 30 is not broken or a disconnection is not occurring in the relevant signal line. Further, in this embodiment, whether or not a disconnection is occurring is determined based on the differential synthesis signal, and therefore, there is no need to inspect the first signal line 4 and the second signal line 5 individually or separately. In a case where the first signal line 4 and the second signal line 5 are both normal, it is possible to determine that the first and second signal lines are both normal without performing the disconnection detecting operations depicted in FIG. 5.

In the disconnection detecting module 37 of the first embodiment, the confirmation signal is a signal having a frequency that is out of the audible frequency band. Due to this, even though the confirmation signal is superposed on the transmission sound signal, noise is not superposed on the audible frequency band that is used for the sound that is the information sent by the transmitting module 36. Additionally, even in a case where the confirmation signal that is contained in the looped back transmission sound signal is outputted from the speaker module 32, there is no risk of audible sound being emitted from the speaker module 32. Due to this, in a case where the confirmation signal is a sound signal falling in the audible frequency band, the sound is emitted from the speaker while a disconnection detection is being performed. However, in the disconnection detecting module 37 of the first embodiment, there is no risk of the user hearing a sound from the speaker even in the midst of disconnection detection. Thus, with the disconnection detecting module 37 of the embodiment, in addition to the advantages described above, there is provided an advantage that a disconnection can be detected without being recognized by the user through his or her hearing sensation. Namely, in the first embodiment, in a case where the confirmation signal is a sound signal falling within the audible frequency band, the sound signal is looped back to be heard as sound from the speaker. On the other hand, in a case where the confirmation signal is a sound signal of a frequency that is out of the audible frequency band, even though the confirmation signal is looped back to be outputted from the speaker, the confirmation signal can be prevented from being heard.

In the voice processing unit 3 of the first embodiment, the detector 372 detects whether or not a disconnection is occurring in the first signal line 4 and the second signal line 5 based on the amplitude of the synthesis signal that is outputted from the reception module 30. By doing so, in the voice processing unit 3 of the first embodiment, it is possible to detect whether or not a disconnection is occurring in the first signal line 4 and the second signal line 5 by comparing the amplitude of the synthesis signal that is outputted from the reception module 30 with the reference value that is determined in advance.

On the other hand, in relation to the signal that is outputted from the reception module 30, the detector 372 may extract a signal having a component of the frequency of the confirmation signal. For example, the detector 372 may include a band pass filter (BPF) that passes only the frequency band of the confirmation signal (for example, frequencies of 16 [kHz] to 24 [kHz] that are out of the audible frequency band). As a result of the detector 372 including the BPF, the frequency component of the confirmation signal can be taken out from the signal that is outputted from the reception module 30. When the signal that is outputted from the reception module 30 is caused to be inputted into the BPF, in a case where a signal equal to or greater than a predetermined level is outputted from the BPF, the detector 372 determines that no disconnection is occurring in the first signal line 4 and the second signal line 5. Even in this case, it is possible to detect whether or not the confirmation signal is contained in the signal that is outputted from the reception module 30. Namely, the detector 372 can detect whether or not a disconnection is occurring in the first signal line 4 and the second signal line 5.

In the voice processing unit 3 (the example of the "signal processing unit") of the first embodiment, the outputting module 38 outputs the result of the determination made by the disconnecting detecting module 37 to the external unit 2. By doing so, in the voice processing unit 3 of the first embodiment, in addition to the advantages described heretofore, it is possible to inform of whether or not a disconnection is occurring somewhere along the signal lines of the voice processing unit 3 by outputting the result of the detection carried out during disconnection detection to the external unit 2. Thus, with the voice processing unit 3 of the first embodiment, it is possible to inform the control center of the location where the disconnection is occurring.

In relation to the signal that is outputted from the reception module 30, the detector 372 may extract a signal having components of the amplitude and frequency of the confirmation signal. As this occurs, it is possible to detect whether or not the confirmation signal is contained in the signal outputted from the reception module 30 more accurately. Namely, the detector 372 can detect whether or not a disconnection is occurring in the first signal line 4 and the second signal line 5 more accurately.

In this embodiment, the positive reception signal is described as being inputted into the voice processing unit 3 by way of the first signal line while the negative reception signal is described as being inputted into the voice processing unit 3 by way of the second signal line. However, the positive reception signal may be inputted into the voice processing unit 3 by way of the second signal line while the negative reception signal may be inputted into the voice processing unit 3 by way of the first signal line.

Second Embodiment

Figure 6:
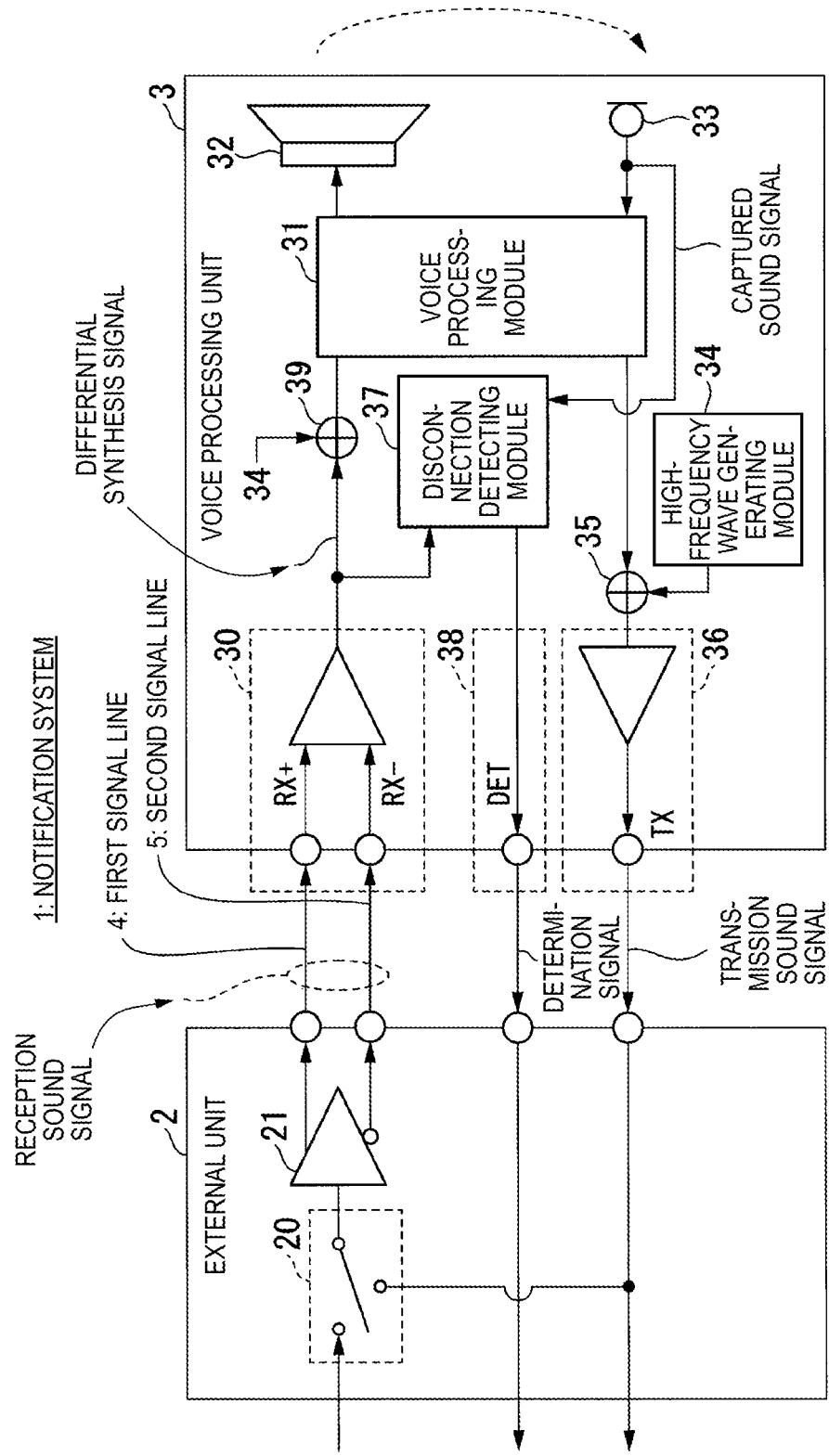
FIG. 6 is a block diagram showing the configuration of a notification system 1 according to a second embodiment of the invention.

Next, a second embodiment will be described. FIG. 6 is a block diagram showing the configuration of a notification system 1 according to the second embodiment. In the following description, like reference numerals will be given to like configurations to those of the first embodiment, and the description thereof will be omitted here.

In the second embodiment, a disconnection detecting module 37 determines whether or not a speaker module 32 and a microphone module 33 fail (executes a failure determination). The disconnection detecting module 37 may determine only on a failure of the speaker module 32 and the microphone module 33 or may determine on a failure of the speaker module 32 and the microphone module 33 in addition to the determinations made in the first embodiment. In a case where the disconnection detecting module 37 determines on a failure of the speaker module 32 and the microphone module 33 in addition to the determinations made in the first embodiment, the disconnection detecting module 37 can not only determine on a failure of a reception module 30, the speaker module 32, the microphone module 33 and a transmitting module 36 but also detect a disconnection along signal lines from the transmitting module 36 to the reception module 30.

In the second embodiment, an adding module 39 is placed between the reception module 30 and a voice processing module 31. The adding module 39 adds a signal from the reception module 30 and a confirmation signal generated by a high-frequency wave generating module 34 together. The adding module 39 outputs a signal resulting from the addition to the voice processing module 31.

In the second embodiment, the disconnection detecting module 37 makes the high-frequency wave generating module 34 generate a confirmation signal at a timing at which a detection controller 371 executes a failure determination. A confirmation signal generated by the high-frequency wave generating module 34 is superposed on a differential synthesis signal by the adding module 39. The voice processing module 31 outputs a signal from the adding module 39 to the speaker module 32. The speaker module 32 emits the signal from the voice processing module 31 as sound. The sound emitted by the speaker module 32 is captured by the microphone module 33.

In the second embodiment, a signal from the microphone module 33 is outputted to the disconnection detecting module 37. Namely, a sound signal (a captured sound signal) that is captured by the microphone module 33 is inputted into the disconnection detecting module 37. In the second embodiment, the captured sound signal from the microphone module 33 includes a sound that is emitted from the speaker module 32 in addition to sound on the circumference of a microphone. The confirmation signal is superposed on the sound emitted from the speaker module 32. Thus, in a case where signal lines in the speaker module 32 and the microphone module 33 are normal, the captured sound signal including the confirmation signal is inputted into the disconnection detecting module 37.

The disconnection detecting module 37 determines whether or not either or both of the speaker module 32 and the microphone module 33 are normal based on the captured sound signal from the microphone module 33. Specifically speaking, a detector 372 of the disconnection detecting module 37 compares the amplitude of the captured sound signal from the microphone module 33 with a reference value that is determined in advance. Additionally, the detector 372 extracts a signal having a frequency that is included in the confirmation signal from the captured sound signal. Then, in a case where the amplitude of the captured sound signal meets the predetermined reference value, the detector 372 decides that the speaker module 32 and the microphone module 33 are both normal. In a case where a frequency component contained in the confirmation signal is contained in the captured sound signal, the detector 372 decides that the speaker module 32 and the microphone module 33 are both normal.

On the other hand, in a case where the amplitude of the captured sound signal does not meet the predetermined reference value, the detector 372 decides that at least either of the speaker module 32 and the microphone module 33 is not normal or fails. In a case where the captured sound signal does not include the frequency component that is included in the confirmation signal, the detector 372 decides that at least either of the speaker module 32 and the microphone module 33 fails.

Thus, as has been described heretofore, in the disconnection detecting module 37 (an example of a "disconnection detecting device"), the detection controller 371 (an example of a "confirmation signal outputting module") causes the transmission sound signal including the confirmation signal to be emitted from the speaker module 32 of the voice processing unit 3 (an example of a "signal processing unit") and detects whether or not a failure is occurring in at least either of the speaker module 32 and the microphone module 33 based on the signal outputted from the microphone module 33 of the voice processing unit 3 that captures the sound emitted from the speaker module 32. By doing so, in the disconnection detecting module 37 of the second embodiment, a failure can be detected in relation to the speaker module 32 and the microphone module 33 while the disconnection detection is performed in relation to the first signal line 4 and the second signal line 5 as described above.

In the first embodiment and the second embodiment, the confirmation signal that the high-frequency wave generating module 34 generates may be such that a plurality of signals having different frequencies are sequentially repeated at predetermined time intervals. The confirmation signal may be a signal whose frequency changes sequentially in the order of 19 [kHz], 20 [kHz] and 21 [kHz] at predetermined time intervals. As this occurs, it is desirable that the amplitude of the signal changes smoothly when the frequencies are switched. This can prevent superposition of noise on a transmission sound signal that would otherwise be caused by a drastic change in amplitude when the frequencies are switched.

When the confirmation signal is such that a plurality of signals having different frequencies are sequentially repeated at predetermined time intervals, for example, the detector 372 includes a plurality of BPFs having cut-off frequency bands that differ from one another. For example, in a case where the confirmation signals such that signals of 19 [kHz], 20 [kHz] and 21 [kHz] are repeated, the detector 372 includes BPFs corresponding to the frequencies of the signals, that is, a BPF-1 that passes the signal of 19 [kHz], a BPF-2 that passes the signal of 20 [kHz] and a BPF-3 that passes the signal of 21 [kHz].

Then, the detector 372 determines whether or not there exists a case where a predetermined amplitude is detected in the signal outputted from the BPF-1 while predetermined amplitudes are not detected in the signals outputted from the BPF-2 and the BPF-3. When the detector 372 detects such a case, the detector 372 determines during the next time interval whether or not there exists a case where the predetermined amplitude is detected in the signal outputted from the BPF-2 while the predetermined amplitudes are not detected in the signals outputted from the BPF-3 and the BPF-1. When the detector 372 detects such a case, the detector 372 determines during the next time interval whether or not there exists a case where the predetermined amplitude is detected in the signal outputted from the BPF-3 while the predetermined amplitudes are not detected in the signals outputted from the BPF-1 and the BPF-2. In this way, in a case where the detector 372 detects the predetermined amplitudes in the signals outputted from the BPFs in the order of the BPF-1, the BPF-2 and the BPF-3, the detector 372 determines that the transmitting module 36, the reception module 30 and the differential signal in the reception module 30 are each normal.

In the first embodiment and the second embodiment, the detector 372 may extract the frequency of the confirmation signal by analyzing frequencies through signal processing such as Fourier transformation. As this occurs, the detector 372 can extract a frequency characteristic of the signal that is outputted from the reception module 30. For example, the detector 372 can calculate relative amounts of the signals having the frequencies of 19 [kHz], 20 [kHz] and 21 [kHz] that are included in the signal outputted from the reception module 30. As this occurs, the detector 372 may not include BPFs.

In the first embodiment and the second embodiment, the confirmation signal may be a burst signal in which a section where a signal is generated (a signal section) and a section where no signal is generated (a no-signal section) are repeated periodically. In a case where the confirmation signal is a burst signal, it is desirable that a maximum amplitude (an envelope) of the confirmation signal changes gradually when the signal section and the no-signal section are switched. This can prevent superposition of noise on a transmission sound signal that would otherwise be caused by a drastic change in amplitude occurring at a boundary between the signal section and the no-signal section.

With the confirmation signal made up of a burst signal, in a case where a ratio of a section where a predetermined reference value is exceeded to a section where the predetermined reference value is not reached becomes a ratio of the signal section to the no-signal section at a period where the signal section and the no-signal section are added together, the detector 372 can detect that a disconnection is not occurring in each of the first signal line 4 and the second signal line 5 in the first embodiment. In addition, in this case, the detector 372 can detect that a failure is not occurring in each of the speaker module 32 and the microphone module 33 in the second embodiment.

In the first embodiment and the second embodiment, the voice processing unit 3 and the whole or part of the disconnection detecting module 37 may be realized by a computer. As this occurs, a program to realize this function is recorded on a computer readable storage medium, and a computer system is caused to read the program stored on the storage medium thereinto for execution to realize the function. When referred to here, the "computer system" is understood to include an OS and hardware such as peripheral devices. Additionally, when referred to here, the "computer readable storage medium" means a storage device such as a portable medium including a flexible disc, an optical magnetic disc, a ROM and a CD-ROM, and a hard disc that is incorporated in the computer system. Further, the "computer readable storage medium" may include a medium that holds a program dynamically for a short period of time like a communication line used in transmitting a program via a network such as an Internet or a communication line such as a telephone line or a medium that holds a program for a certain period of time like a volatile memory installed in an interior of the computer system which becomes servers and clients in that case. The program may be a program that realizes part of the function, a program that can realize the function by a combination with a program that is recorded in advance in the computer system or a program that realizes the function using a programmable logic device such as a Field Programmable Gate Array (FPGA).

Thus, while the invention has been described through the embodiments of the invention, the embodiments are not intended to limit claims of the invention. All the combinations of characteristics that are described in the embodiments are not necessarily essential to solve the problem. In the drawings, like reference numerals are given from time to time to the same or like portions to omit repeated descriptions. In the drawings, the shapes and sizes of the constituent elements are exaggerated from time to time to illustrate them clearly.

In the whole of the specification, when a certain portion is described as "including," "having," or "comprising" a certain constituent element, this means that the certain portion does not exclude other constituent elements and hence can include further those other constituent elements, if not described otherwise.

Thus, while the embodiments of the invention have been described in detail by reference to the drawings, the specific configurations are not limited to these embodiments and hence include any other designs without departing from the spirit and scope of the invention.

It should be noted that execution orders of the processing operations such operations, procedures, steps and stages in the devices, units, modules, systems, programs and methods shown in claims, the specification and the drawings can be realized by arbitrary orders, provided that particular phrases such as "prior to," and "before" are not stated clearly or that an output from the prior operation is not used in the following operation or an output of the current operation is not used in a post operation. In relation to the flow of operations in claims, the specification and the drawings, although the flow of operations is described using words such as "firstly," and "next" as a matter of conveniences, this does not mean that it is essential to perform the operations in that order.

The invention claimed is:

1. A disconnection detecting device comprising:
a confirmation signal outputting module configured to cause a transmission sound signal to be outputted from a signal processing unit, the transmission sound signal including a confirmation signal having a frequency that differs from a frequency band for use in communicating information contained in the transmission sound signal that is sent from the signal processing unit to a communication unit; and
a detector configured to detect whether or not a disconnection is occurring in a connection wire based on the transmission sound signal including the confirmation signal that is returned from the communication unit to the signal processing unit via the connection wire.

2. The disconnection detecting device according to claim 1, wherein
the connection wire includes a first signal line and a second signal line, and
the detector detects whether or not a disconnection is occurring in the first signal line and the second signal line based on signal components of a synthesis signal into which a first signal sent by way of the first signal line and a second signal sent by way of the second signal line are synthesized.

3. The disconnection detecting device according to claim 2, wherein
the detector detects any one of conditions in which a disconnection is occurring in both the first signal line and the second signal line, a disconnection is occurring in either of the first signal line and the second signal line, and the first signal line and the second signal line are both normal, based on the synthesis signal or at least one of the first signal and the second signal.

4. The disconnection detecting device according to claim 2, wherein
the first signal and the second signal are a pair of differential signals, and
the synthesis signal is obtained by deducting the second signal from the first signal.

5. The disconnection detecting device according to claim 2, wherein
the detector detects whether or not a disconnection is occurring in the first signal line and the second signal line based on at least one of an amplitude and frequency of the synthesis signal.

6. The disconnection detecting device according to claim 5, wherein
the detector detects whether or not a disconnection is occurring in the first signal line and the second signal line based on the amplitude of the synthesis signal.

7. The disconnection detecting device according to claim 6, wherein
the detector determines that a disconnection is occurring in both the first signal line and the second signal line in a case where the amplitude is equal to or smaller than a first reference amplitude,
determines that a disconnection is occurring in one of the first signal line and the second signal line in a case where the amplitude is greater than the first reference amplitude and is equal to or smaller than a second reference amplitude, and
determines that a disconnection is not occurring in both the first signal line and the second signal line in a case where the amplitude is greater than the second reference amplitude, and
the second reference amplitude is greater than the first reference amplitude.

8. The disconnection detecting device according to claim 5, wherein
the detector detects whether or not a disconnection is occurring in the first signal line and the second signal line based on the frequency of the synthesis signal.

9. The disconnection detecting device according to claim 8, wherein
the detector determines that a disconnection is not occurring in both the first signal line and the second signal line in a case where a component of the frequency of the confirmation signal is included in the synthesis signal in an amount equal to or greater than a reference value.

10. The disconnection detecting device according to claim 1, wherein
the confirmation signal is a signal having a frequency that is out of an audible frequency band.

11. The disconnection detecting device according to claim 1, wherein
the confirmation signal outputting module, causes the transmission sound signal that includes the confirmation signal to be emitted from a speaker module of the signal processing unit, and detects whether or not a failure is occurring in at least one of the speaker module and a microphone module of the signal processing unit that captures a sound that is emitted from the speaker module based on a signal that is outputted from the microphone module.

12. A signal processing unit comprising:
the disconnection detecting device according to claim 1; and
an outputting module configured to output a result of a determination made by the disconnection detecting device to the communication unit.

13. A disconnection detecting method comprising:
outputting a transmission sound signal from a signal processing unit, the transmission sound signal including a confirmation signal having a frequency that differs from a frequency band for use in communicating information contained in the transmission sound signal that is sent from the signal processing unit to a communication unit; and
detecting whether or not a disconnection is occurring in connection wires based on the transmission sound signal including the confirmation signal that is returned from the communication unit to the signal processing unit via the connection wires.

* * * * *